(12) United States Patent
Sakai

(10) Patent No.: US 8,524,574 B2
(45) Date of Patent: *Sep. 3, 2013

(54) METHOD FOR MANUFACTURING SOLID-STATE IMAGE PICKUP-DEVICE

(75) Inventor: Chiaki Sakai, Kanagawa (JP)

(73) Assignee: Sony Corporation (JP)

( * ) Notice: Subject to any disclaimer, the term of this patent is extended or adjusted under 35 U.S.C. 154(b) by 160 days.

This patent is subject to a terminal disclaimer.

(21) Appl. No.: 13/029,320

(22) Filed: Feb. 17, 2011

(65) Prior Publication Data

US 2011/0136295 A1 Jun. 9, 2011

Related U.S. Application Data

(63) Continuation of application No. 12/686,021, filed on Jan. 12, 2010, now Pat. No. 7,897,427.

(30) Foreign Application Priority Data

Jan. 20, 2009 (JP) ................................. 2009-009525

(51) Int. Cl.
*H01L 21/00* (2006.01)

(52) U.S. Cl.
USPC .................... 438/459; 438/57; 257/E21.568

(58) Field of Classification Search
USPC .................... 438/458, 459, 455, 57
See application file for complete search history.

(56) References Cited

U.S. PATENT DOCUMENTS 7,897,427 B2 * 3/2011 Sakai .............................. 438/70

FOREIGN PATENT DOCUMENTS

JP 2007-013089 1/2007

* cited by examiner

*Primary Examiner* — Charles Garber
*Assistant Examiner* — Reema Patel
(74) *Attorney, Agent, or Firm* — Sheridan Ross P.C.

(57) ABSTRACT

A method for manufacturing a solid-state image device which includes the steps of: forming a silicon epitaxial growth layer on a silicon substrate; forming photoelectric conversion portions, transfer gates, and a peripheral circuit portion in and/or on the silicon epitaxial growth layer and further forming a wiring layer on the silicon epitaxial growth layer; forming a split layer in the silicon substrate at a side of the silicon epitaxial growth layer; forming a support substrate on the wiring layer; peeling the silicon substrate from the split layer so as to leave a silicon layer formed of a part of the silicon substrate at a side of the support substrate; and planarizing the surface of the silicon layer.

12 Claims, 12 Drawing Sheets

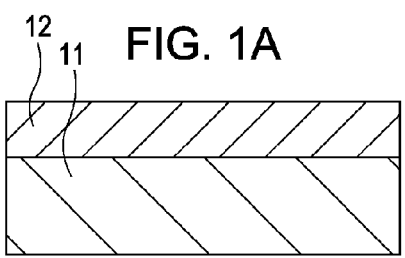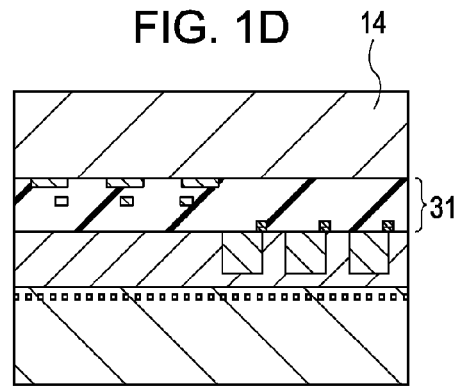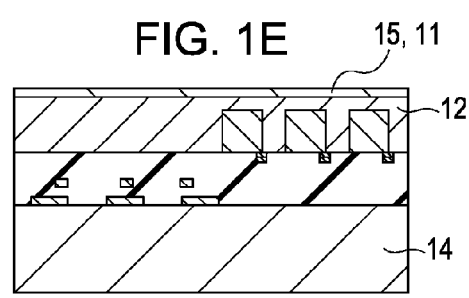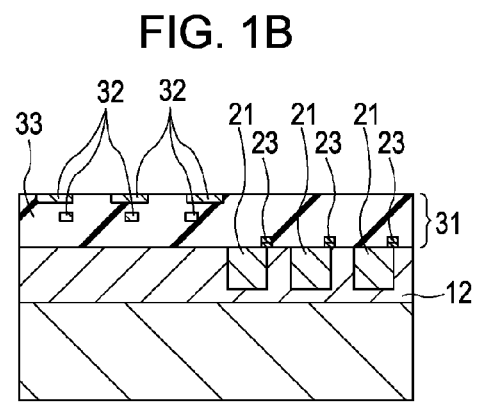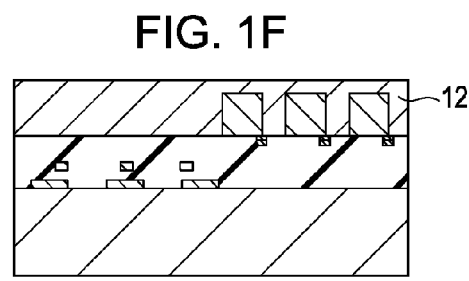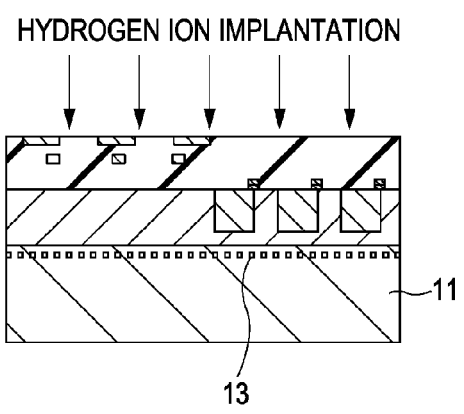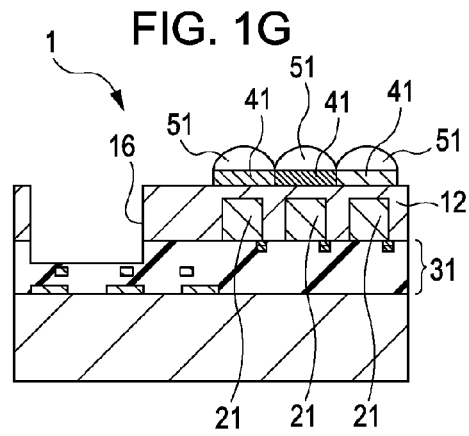

ENLARGED VIEW

☐ IMPLANTATION REGION
▒ NON-IMPLANTATION REGION

☐ IMPLANTATION REGION
▒ NON-IMPLANTATION REGION

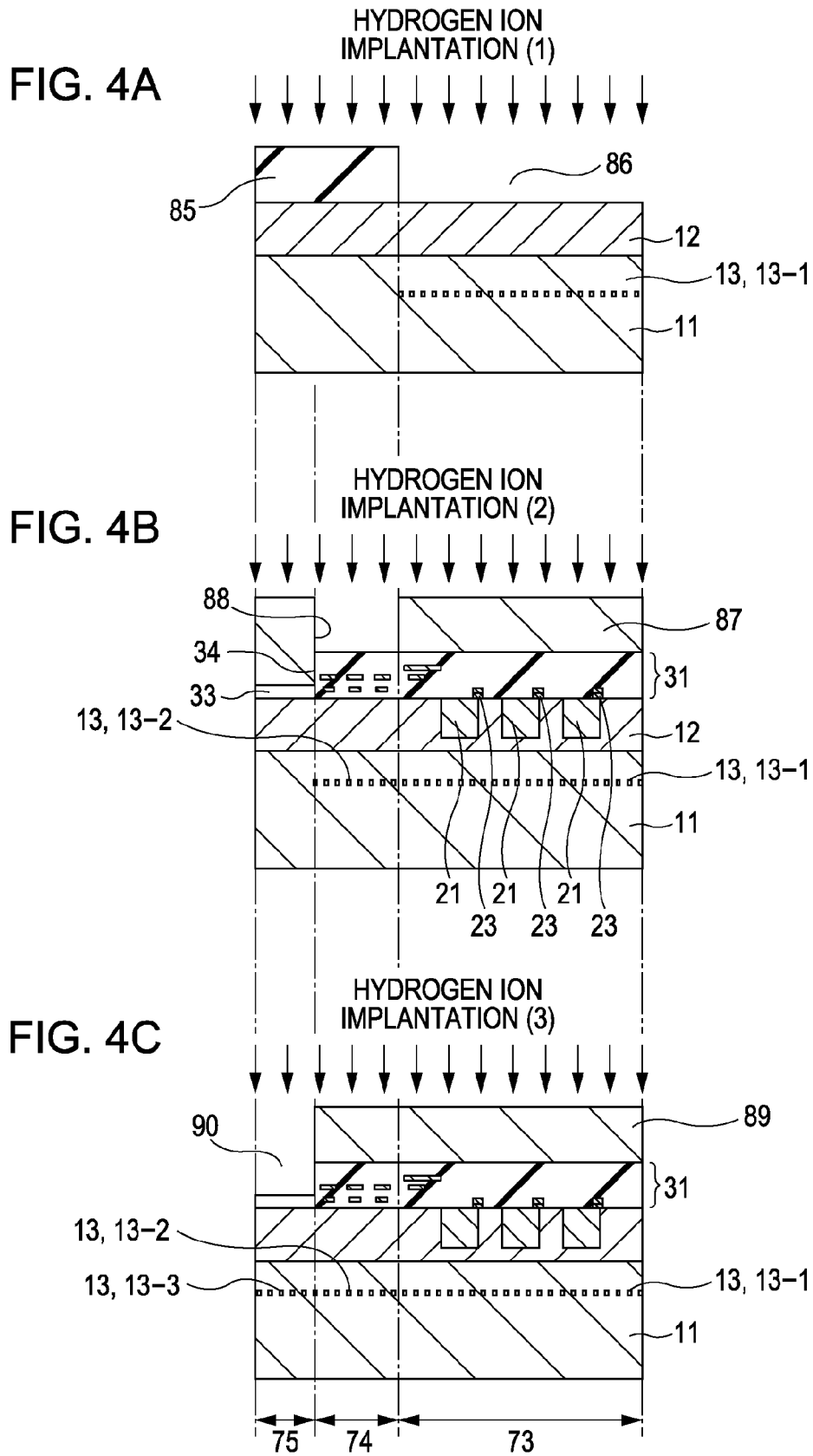

HYDROGEN ION IMPLANTATION

METHOD FOR MANUFACTURING SOLID-STATE IMAGE PICKUP-DEVICE

RELATED APPLICATION DATA

This application is a continuation of U.S. patent application Ser. No. 12/686,021, filed Jan. 12, 2010, the entirety of which is incorporated herein by reference to the extent permitted by law. The present application claims the benefit of priority to Japanese Patent Application No. 2009-009525 filed in the Japan Patent Office on Jan. 20, 2009, the entirety of which is incorporated by reference herein to the extent permitted by law.

BACKGROUND OF THE INVENTION

1. Field of the Invention

The present invention relates to a method for manufacturing a solid-state image device.

2. Description of the Related Art

Compared to a related surface irradiation type image sensor, a rear surface irradiation type image sensor has drawn attention which can completely eliminate a decrease in sensitivity caused by reflection (so-called eclipse) at a wiring layer or the like as well as can increase an aperture area. The surface irradiation type image sensor is an image sensor in which a wiring layer is formed closer to a light incident side than a photoelectric conversion region. In addition, the rear surface irradiation type image sensor is an image sensor in which a wiring layer is formed at a side opposite to a light incident side with respect to a photoelectric conversion region.

There has been a plurality of manufacturing methods of image sensors. In the manufacturing methods mentioned above, in general, the formation of a photoelectric conversion region in a complete state is important.

For example, elimination of physical defects, such as scratches and cuts, from the surface of the photoelectric conversion region is important. In addition, elimination of metal contamination from the photoelectric conversion region is also important. Furthermore, it is also important to ensure image pick-up characteristics, such as sensitivity and transfer characteristics. That is, in other words, it is important that the photoelectric conversion region have an ideal profile of various image pick-up characteristics.

In addition, as a particular important point of the rear surface irradiation type image sensor, a hole-accumulation diode (HAD) layer at an incident light surface side is formed uniform. Furthermore, also as a particular important point, the width of the photoelectric conversion region, that is, the thickness of a silicon active layer, is preferably formed uniform.

As one manufacturing method that can satisfy the above important points, a manufacturing method using a silicon on insulator (SOI) substrate has been proposed (for example, see Japanese Unexamined Patent Application Publication No. 2007-13089).

In the manufacturing method in which an SOI substrate is used for forming an image sensor, since the price of the SOI substrate is high, the price of the image sensor is also increased.

In addition, when an SOI structure is formed, a silicon oxide layer, which is called a BOX layer, is inevitably formed. Hence, because of the presence of a silicon oxide layer having a different coefficient of thermal expansion from that of a silicon substrate, the silicon substrate is adversely influenced (for example, generation of warping) in a high-temperature processing treatment, and as a result, the crystallinity and temperature controllability of an active layer are degraded.

As the high-temperature processing treatment, for example, there may be mentioned an activation (annealing) treatment in which ion species introduced primarily by an ion implantation method are activated, or an epitaxial growth treatment which is performed to increase the thickness of an active layer.

For example, in a related furnace type heat treatment which has been frequently used, primarily because of the difference in coefficient of thermal expansion between a silicon substrate and a silicon oxide layer, degradation in crystallinity, such as generation of slip lines, occurs.

On the other hand, in a heat treatment using a lamp heating system (so-called RTA method) which has been widely spread to overcome redistribution of impurities concomitant with the trend toward miniaturization of elements, the substrate is heated by radiation of infrared rays and absorption by a silicon substrate (heat conversion). In a heat treatment by the heating system as described above, instability is induced not only in a heating mechanism but also in a temperature control (radiation thermometer).

In addition, since the silicon oxide layer (BOX layer) is present in the SOI substrate functioning as a barrier for the elimination (such as gettering) of metal contamination in a silicon active layer, the gettering effect is degraded. As described above, the silicon oxide layer considerably restricts the elimination of metal contamination, and hence it becomes difficult to suppress the generation of dark current/white spots.

The gettering is a technique in which the state of absorbing metal contamination species is formed in a region other than an active layer of a silicon substrate, the region having no influence on operation of an element, and in which the degree of cleanness of an element portion is ensured to obtain desired characteristics.

As a general example and as a technique closely relating to the manufacturing method according to an embodiment of the present invention, there has been an intrinsic gettering (IG) method.

In the intrinsic gettering method, in order to form a denuded zone (DZ) layer which is free from defects, a region to be formed into a DZ layer is preferably set apart from that in which an intrinsic gettering layer is formed by slightly more than 10 μm, and the region thus formed is a region free from defects.

In a silicon (active) layer of a current SOI substrate, the state described above is difficult to obtain from a structural point of view, and even if the above state can be obtained, the superiority (such as decrease in parasite capacity) of the SOI substrate is degraded, and hence the use of the SOI substrate is not realistic.

Furthermore, when the gettering function is imparted to a base substrate, the silicon oxide layer (BOX layer) considerably suppress the diffusion of impurities, and hence it becomes difficult to decrease impurities in an active layer region.

On the other hand, in a smartcut substrate, defect generation occurs in a SOI portion due to the generation of a foreign substance in a process, and in a step after the SOI portion is adhered to a support substrate, metal contamination (wiring material) occurs.

First, a smartcut method will be described.

As shown in FIG. 8A, a silicon substrate 111 is prepared.

Next, as shown in FIG. 8B, the surface of the silicon substrate 111 is oxidized to form a silicon oxide layer 112.

Subsequently, as shown in FIG. 8C, hydrogen ions are implanted in the silicon substrate 111 by an ion implantation method to form a split layer 113.

Then, as shown in FIG. 8D, a support substrate 121 is adhered to the silicon substrate 111 with the silicon oxide layer 112 interposed therebetween. For the support substrate 121, for example, a silicon substrate is used. In addition, the support substrate 121 is adhered to a surface of the silicon substrate 111 closer to a side of the split layer 113.

For example, as shown in FIG. 8E, the silicon substrate 111 is peeled away from the split layer 113 so as to leave a silicon layer 114 formed of a part of the silicon substrate 111 which is located closer to a side of the support substrate 121 than the split layer 113.

As a result, as shown in FIG. 8F, an SOI substrate 110 is completed in which the silicon layer 114 is formed on the support substrate 121 with the silicon oxide layer 112 interposed therebetween.

In the smartcut method described above, for example, when a foreign substance 131 is present on the surface of the silicon oxide layer 112 formed on the silicon substrate 111 in an ion implantation step as shown in FIG. 9A, the foreign substance 131 functions as an ion implantation mask. Hence, in the silicon substrate 111 in which a region of the foreign substance is projected, a region in which hydrogen ions are not implanted is formed. As a result, a region 133 in which the split layer 113 is not formed is generated in the silicon substrate 111.

In the state as described above, as shown in FIG. 9B, the base substrate 121 (which is heretofore called the "support substrate 121") is adhered to the silicon substrate 111 with the silicon oxide layer 112 interposed therebetween, and the silicon substrate 111 (not shown) is peeled away at the split layer 113. As a result, the silicon layer 114 formed of the silicon substrate 111 to be left on the base substrate 121 with the silicon oxide layer 112 interposed therebetween is not left in the region 133 in which the split layer 113 is not formed. That is, the silicon layer 114 (not shown) in the above region is peeled away together with the silicon substrate 111 (not shown) which is peeled away. Furthermore, the silicon oxide layer 112 in the above region is also peeled away. As a result, in the silicon layer 114 on the base substrate 121, a partial void 115 is formed at the portion at which the silicon oxide layer 112 is peeled away together with the silicon substrate 111.

In addition, for example, as shown in FIG. 10A, when the base substrate 121 is adhered to the silicon substrate 111 with the silicon oxide layer 112 interposed therebetween, the foreign substance 131 may enter between the silicon oxide layer 112 and the base substrate 121 in some cases. In this case, the split layer 113 is formed in advance in the silicon substrate 111 by ion implantation.

Subsequently, as shown in FIG. 10B, when the silicon substrate 111 (not shown) is peeled away at the split layer 113, the silicon layer 114 formed of the silicon substrate 111 which is to be left on the base substrate 121 with the silicon oxide layer 112 interposed therebetween is left. In this step, in the region in which the foreign substance 131 (see FIG. 9A) is present, since the adhesion between the silicon oxide layer 112 and the base substrate 121 is weak, the silicon layer 114 (not shown) in the region in which the adhesion is weak is peeled away together with the silicon substrate 111 (not shown) which is peeled away. Furthermore, the silicon oxide layer 112 (not shown) in the above region is also peeled away. Hence, the partial void 115 is generated in the silicon layer 114 on the base substrate 121 at the portion at which the silicon oxide layer 112 is peeled away together with the silicon substrate 111.

Hereinafter, the case in which a solid-state image device (image sensor) is formed using the SOI substrate which is formed as described above will be described. This manufacturing method is a manufacturing method in which the smartcut method is applied to the manufacturing method disclosed in Japanese Unexamined Patent Application Publication No. 2007-13089.

For example, as shown in FIG. 11A, photoelectric conversion portions 141, transistor elements 142, and the like are formed in and/or on the silicon layer 114 of the SOI substrate 101. Furthermore, an insulating layer 143 including a wiring layer (not shown) is formed. In addition, a support substrate 151 is adhered to the surface of the insulating layer 143.

Subsequently, as shown in FIG. 11B, the base substrate 121 (which is indicated by a two-dot chain line) of the SOI substrate 101 is removed by a grinding and a chemical liquid treatment (such as etching by a mixture of hydrogen fluoride/nitric acid). In this case, in a region in which the silicon oxide layer 112 is not formed, etching proceeds. As a result, even the silicon layer 114 is etched and is removed. That is, since the silicon oxide layer 112 is partially removed and is not able to function as an etching stopper, the silicon layer 114 is continuously etched.

Incidentally, in the etching using a mixture of hydrogen fluoride/nitric acid, the etching rate of the base substrate 121 made of silicon (such as single crystal silicon) is approximately 165 times that of the silicon oxide layer 112, and hence the silicon oxide layer 112 functions as an etching stopper.

In addition, as shown in FIG. 12, in an etching proceeding region of the silicon layer 114, wires 145, connection plugs 146, and the like of a wiring layer 144 formed in the insulating layer 143 are corroded by etching species, so that the entire wiring layer 144 is corroded by etching.

Hence, when the smartcut method is used for the manufacturing method disclosed in Japanese Unexamined Patent Application Publication No. 2007-13089, metal species (such as aluminum or copper) of a wiring material may not only cause contamination of production facilities/lines but may also widely cause various types of defects in quality.

Alternatively, after an SOI substrate is formed by the smartcut method, by the use of this SOI substrate, photoelectric conversion portions, transfer gates, and the like are formed in and/or on a silicon layer of the SOI substrate, and a wiring layer is further formed on the silicon layer. Subsequently, after a support substrate is adhered to a side of the wiring layer, a silicon substrate side of the SOI substrate is removed, for example, by grinding, polishing, and/or etching, and further a silicon oxide layer of the SOI substrate is removed by etching. In an image sensor element formed by the manufacturing method as described above, by corrosion caused by the defect of the above silicon oxide layer, only the above image sensor element is a defective.

The phenomenon caused by a foreign substance described above is a fatal problem of the smartcut method, and although the above method may be probably improved, the problem caused by the above phenomenon may not be completely solved nor overcome.

SUMMARY OF THE INVENTION

The problems to be solved by the present invention are that cost is increased since an SOI substrate is used, and that a foreign substance has an adverse influence on a smartcut method.

It is desirable to provide a rear surface irradiation type solid-state image device which uses no SOI substrate and which solves the problem of a smartcut method caused by a foreign substance.

A method for manufacturing a solid-state image device according to an embodiment of the present invention includes the steps of: forming a silicon epitaxial growth layer on a silicon substrate; forming photoelectric conversion portions, transfer gates, and a peripheral circuit portion in and/or on the silicon epitaxial growth layer and further forming a wiring layer on the silicon epitaxial growth layer; forming a split layer in the silicon substrate at a side of the silicon epitaxial growth layer; forming a support substrate on the wiring layer; peeling the silicon substrate from the split layer so as to leave a silicon layer formed of a part of the silicon substrate at a side of the support substrate; and planarizing the surface of the silicon layer.

In the method for manufacturing a solid-state image device according to an embodiment of the present invention, since the substrate including the silicon substrate and the silicon epitaxial growth layer formed thereon is used, no SOI substrate is used. In addition, after the wiring layer is formed on the silicon epitaxial growth layer, the split layer is formed in the silicon substrate, and the support substrate is formed on the wiring layer. Accordingly, even if a foreign substance is present on the wiring layer, when the silicon substrate is peeled away, the silicon epitaxial growth layer is not peeled away together with the silicon substrate due to the influence of a foreign substance.

In the method for manufacturing a solid-state image device according to an embodiment of the present invention, since an expensive SOI substrate is not used, manufacturing can be performed at a low cost. In addition, since an adverse influence of a foreign substance is not generated when the silicon substrate is peeled away, a high quality solid-state image device can be advantageously manufactured with a high yield.

BRIEF DESCRIPTION OF THE DRAWINGS

FIGS. 1A to 1G are manufacturing-process cross-sectional views showing one example of a manufacturing method of a solid-state image device according to an embodiment of the present invention;

FIGS. 4A to 4C are manufacturing-process cross-sectional views showing Modified Example 3 of the manufacturing method of a solid-state image device according to an embodiment of the present invention;

DESCRIPTION OF THE PREFERRED EMBODIMENTS

Figure 2A:
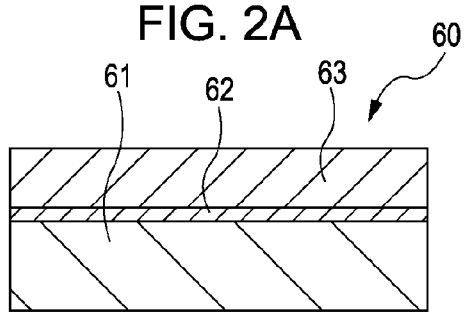
FIGS. 2A to 2E are manufacturing-process cross-sectional views showing a comparative example of the manufacturing method of a solid-state image device according to an embodiment of the present invention.

Hereinafter, the best mode (hereinafter referred to as an "embodiment") for carrying out the present invention will be described.

<1. Embodiment>

[One Example of a Manufacturing Method of a Solid-State Image Device]

One example of a manufacturing method of a solid-state image device according to an embodiment of the present invention will be described with reference to manufacturing-process cross-sectional views of FIGS. 1A to 1G.

[Formation of the Silicon Epitaxial Growth Layer]

As shown in FIG. 1A, a silicon substrate 11 is prepared which has a mirror-polished surface and which is processed by a gettering treatment.

Next, a silicon epitaxial growth layer 12 is formed on the silicon substrate 11.

The epitaxial growth is performed at a substrate temperature, for example, of 1,100° C. to form a silicon epitaxial growth layer having a thickness, for example, of approximately 8 μm. The thickness of this silicon epitaxial growth layer 12 is appropriately selected.

For example, in order to form photoelectric conversion portions in the silicon epitaxial growth layer 12, the thickness thereof is preferably at least 3 μm. In particular, in order to form a photoelectric conversion portion having a sensitivity in a long wavelength region, the thickness described above is preferably approximately 6 μm; hence, when the silicon epitaxial growth layer 12 is formed to have a thickness of approximately 6 to 8 μm, photoelectric conversion portions each having a sensitivity in a long wavelength region can be formed.

As a silicon starting material used for the above silicon epitaxial growth, materials which are used for a general semiconductor process, such as tetrachlorosilane ($SiCl_4$), trichlorosilane ($SiHCl_3$), dichlorosilane ($SiH_2Cl_2$), monosilane ($SiH_4$), may be used. For example, trichlorosilane ($SiHCl_3$) or dichlorosilane ($SiH_2Cl_2$) is used.

As the epitaxial growth conditions, either an atmospheric chemical vapor deposition (CVD) method or a reduced-pressure CVD method may be used, and the growth temperature is set so as to satisfy both the crystallinity and the productivity.

[Formation of the Photoelectric Conversion Portions and the Like]

Next, as shown in FIG. 1B, photoelectric conversion portions 21, transfer gates 23, and a peripheral circuit portion (not shown) are formed in and/or on the silicon epitaxial growth layer 12.

Subsequently, a wiring layer 31 is formed on the silicon epitaxial growth layer 12. The above wiring layer 31 is formed, for example, of wires 32 and an interlayer insulating film 33 covering the wires 32.

In addition, the surface of the interlayer insulating film 33 is planarized. This planarization is performed, for example, by chemical mechanical polishing.

As a result, the interlayer insulating film 33 has a surface which is suitably adhered to a support substrate. Incidentally, a protective film (not shown) which is to be planarized as described above may also be formed on the interlayer insulating film 33.

[Formation of a Split Layer]

Next, as shown in FIG. 1C, a split layer 13 is formed in the silicon substrate 11 by ion implantation. For example, this spirit layer 13 is formed so that the silicon substrate 11 in an area at a depth, for example, of approximately 0.1 to 1 μm from the surface of the silicon substrate 11 is to be peeled away in a subsequent step.

In the above ion implantation, by implantation of hydrogen ions, the fragile split layer 13 having a split surface is formed.

For example, the above ion implantation conditions are set so that a project range (Rp) of hydrogen ions is slightly less than 1 μm at an implantation energy of several hundreds of keV.

In the above ion implantation, an impurity other than hydrogen may also be used. For example, an inert element, such as helium (He), may also be used.

As one example of the above ion implantation conditions, the dose is set in the range of $5 \times 10^{16}$ to $1 \times 10^{17}/cm^2$, and the ion implantation energy is set to 300 keV or less (a project range Rp of slightly more than 3 μm). The above conditions are merely described by way of example, and depending on the depth at which the split layer 13 is formed, the conditions may be appropriately determined.

In addition, depending on splitting conditions and the like of the split layer 13, the above dose is preferably optimized.

In addition, when hydrogen ($H_2$) is used together with helium (He) or another inert gas, the total amount thereof is preferably determined so as to satisfy the dose described above, and the dose is also preferably optimized in consideration of the splitting conditions of the split layer 13.

In addition, in consideration of the photoelectric conversion efficiency in a visible wavelength region, in particular, in a long wavelength region, for example, the implantation energy of the manufacturing method according to an embodiment of the present invention is in the range of 1 MeV or less. In this case, it is preferable to keep an extra polishing part to be used for polishing the surface of a silicon layer made of the silicon substrate 11 which is to be left at a side of the support substrate after the silicon substrate 11 is peeled away.

[Adhesion to the Support Substrate]

Next, as shown in FIG. 1D, a support substrate 14 is adhered onto the wiring layer 31.

As the support substrate 14, a silicon substrate is used. Alternatively, a glass substrate or a resin substrate may also be used.

For the above adhesion, a heat resistant resin may be used, or a plasma treatment may be performed.

[Peeling of the Silicon Substrate]

Next, as shown in FIG. 1E, the silicon substrate 11 (see FIG. 1C) is peeled away at the split layer 13 (see FIG. 1C).

As a result, a silicon layer 15 made of the silicon substrate 11 is formed on the silicon epitaxial growth layer 12.

The peeling of the silicon substrate 11 is performed, for example, by a thermal impact using a heat treatment at a temperature of less than 400° C. Alternatively, the peeling may be performed by imparting a physical impact using a nitrogen ($N_2$) blow or a pure water jet flow.

By the method described above, the treatment can be performed at a temperature of less than 400° C.

In addition, since the split layer 13 formed by volume expansion of ions implanted by ion implantation is a fragile layer, the peeling of the silicon substrate 11 can be easily performed at the split layer 13.

[Planarization Treatment]

Next, as shown in FIG. 1F, a planarization treatment is performed on the surface (split surface) of the silicon layer 15 (see FIG. 1E). The planarization treatment is performed, for example, by hydrogen annealing and polishing. This polishing is performed, for example, using chemical mechanical polishing (CMP).

In this step, as shown in the figure, the silicon layer 15 may be removed to expose the surface of the silicon epitaxial growth layer 12. Alternatively, the silicon layer 15 may be allowed to remain.

In addition, etching may be performed on the surface of the silicon layer 15 to remove a native oxide film. Whenever necessary, a scraper treatment may also be performed.

As described above, a processing is performed to improve the surface roughness of the silicon layer 15 or the silicon epitaxial growth layer 12, and as a result, the surface is formed into a light receiving surface.

[Formation of Color Filter Layers and Condenser Lenses]

Next, as shown in FIG. 1G, an opening portion 16 for electrode extension is formed in the wiring layer 31 from a side of the silicon epitaxial growth layer 12. Along light paths of light incident on the photoelectric conversion portions 21, color filter layers 41 are formed on the silicon epitaxial growth layer 12.

Furthermore, condenser lenses 51 introducing incident light to the photoelectric conversion portions 21 are formed on the color filter layers 41.

As described above, a solid-state image device 1 made of a stacked type full-aperture CMOS sensor is formed.

[Comparative Example of the Manufacturing Method of a Solid-State Image Device]

Next, as a comparative example, a manufacturing method of a rear surface irradiation type solid-state image device using an SOI substrate will be described with reference to manufacturing-process cross-sectional views of FIG. 2A to 2E.

[Formation of the SOI Substrate]

As shown in FIG. 2A, an SOI substrate 60 is used as an active element forming substrate. In consideration of the photoelectric conversion efficiency in a visible light region, in this SOI substrate 60, a single crystal silicon layer 63 having a thickness of several micrometers is formed on a base substrate 61 with a silicon oxide layer 62 (BOX layer) interposed therebetween.

For example, in order to form the photoelectric conversion portions in the single crystal silicon layer 63, the thickness thereof is preferably at least 3 μm.

In particular, since a silicon layer having a thickness of approximately 6 μm is preferably used for a photoelectric conversion portion having a sensitivity in a long wavelength region, when the single crystal silicon layer 63 is formed to have a thickness of approximately 6 to 8 μm, a photoelectric conversion portion having a sensitivity in a long wavelength region can be formed.

As a method for manufacturing the SOI substrate 60, there is a method for forming an SOI substrate having a thick silicon layer using an adhesion method and a mechanical polishing method.

In addition, there is also a method for manufacturing an SOI substrate by a process including the steps of forming a split layer in a silicon substrate by hydrogen ion implantation, adhering the base substrate 61 to the above silicon substrate, and subsequently peeling the silicon substrate at the split layer. That is, this is a method for forming a smartcut substrate using an adhesion method.

[Formation of the Photoelectric Conversion Portions and the Like]

Figure 2B:
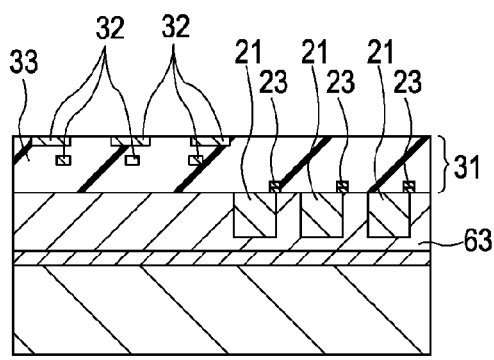

Next, as shown in FIG. 2B, the photoelectric conversion portions 21, the transfer gates 23, and the peripheral circuit portion (not shown) are formed in and/or on the single crystal silicon layer 63.

Next, the wiring layer 31 is formed on the single crystal silicon layer 63. The wiring layer 31 is formed, for example, of the wires 32 and the interlayer insulating film 33 covering the wires 32.

In addition, the surface of the interlayer insulating film 33 is planarized. This planarization is performed, for example, by chemical mechanical polishing. By this planarization, the interlayer insulating film 33 has a surface which is suitably adhered to the support substrate.

Incidentally, a protective film (not shown) which is planarized as described above may also be formed on the interlayer insulating film 33.

[Adhesion of the Support Substrate]

Figure 2C:
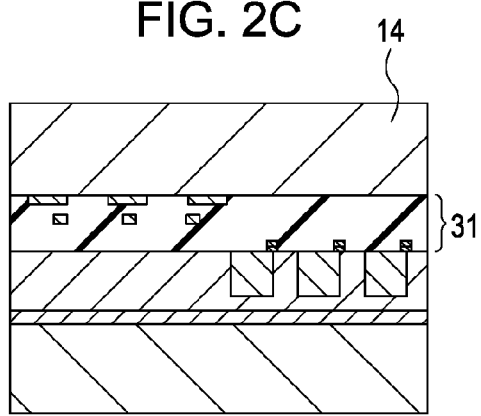

Next, as shown in FIG. 2C, the support substrate 14 is adhered onto the wiring layer 31. As the support substrate 14, a silicon substrate is used. Alternatively, a glass substrate or a resin substrate may also be used.

For the above adhesion, a heat resistant resin may be used, or a plasma treatment may be performed.

[Removal of the Base Substrate]

Figure 2D:
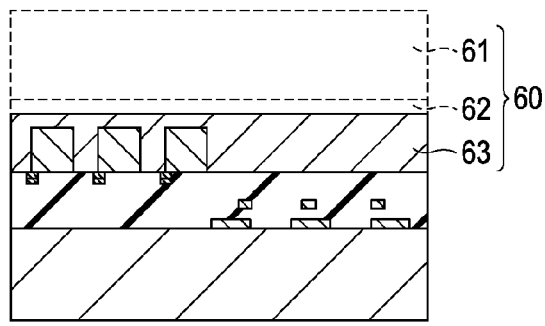

Next, as shown in FIG. 2D, the thickness of the base substrate 61 (shown by a two-dot chain line) which is a mother body of the SOI substrate 60 is decreased by a mechanical polishing method.

Subsequently, the remaining base substrate 61 is removed by a chemical treatment (such as etching), and the silicon oxide layer 62 (shown by a two-dot chain line) forming the SOI substrate 60 is also removed.

As a result, the surface of the single crystal silicon layer 63 (active layer) used as a photoelectric conversion region is exposed, so that a rear surface irradiation type is formed.

[Formation of the Color Filter Layers and the Condenser Lenses]

Figure 2E:
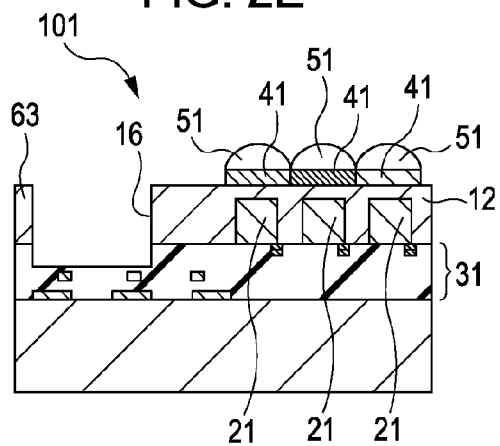

Next, as shown in FIG. 2E, the opening portion 16 for electrode extension is formed in the wiring layer 31 from a side of the single crystal silicon layer 63.

Along light paths of light incident on the photoelectric conversion portions 21, the color filter layers 41 are formed on the single crystal silicon layer 63.

Furthermore, the condenser lenses 51 introducing incident light to the photoelectric conversion portions 21 are formed on the color filter layers 41.

As described above, a solid-state image device 101 made of a stacked type full-aperture CMOS sensor is formed.

[Comparison Between the Manufacturing Method According to an Embodiment of the Invention and that of the Comparative Example]

Subsequently, the manufacturing method according to an embodiment of the present invention described with reference to FIGS. 1A to 1G is compared with the manufacturing method of the comparative example described with reference to FIGS. 2A to 2E.

In the manufacturing method according to an embodiment of the present invention, an expensive SOI substrate is not used unlike the comparative example, the silicon epitaxial growth layer 12 is formed on the inexpensive silicon substrate 11, and this silicon epitaxial growth layer 12 is used as the active layer. Hence, a manufacturing cost for the substrate can be reduced.

In addition, since a silicon substrate which is generally easily available on the market is used, a stable supply of the substrate can be ensured.

In the manufacturing method according to an embodiment of the present invention, the silicon substrate 11 is used which has superior heat stability to that of the SOI substrate 60 used in the comparative example. Hence, by the manufacturing method according to an embodiment of the present invention, production having a so-called wide process window can be performed. That is, since generation of defects caused by warping of the substrate in a heating step can be prevented, a high-quality solid-state image device 1 can be manufacturing with a high yield.

In the manufacturing method according to an embodiment of the present invention, a substrate which is processed by a gettering treatment may be used as the silicon substrate 11. That is, a gettering layer can be formed in the silicon substrate 11, and further a silicon oxide layer which degrades the gettering effect is not formed between the silicon substrate 11 and the silicon epitaxial growth layer 12 which is used as the active layer.

Hence, by the presence of the gettering layer formed in the silicon substrate 11, gettering of metals in the silicon epitaxial growth layer 12 can be easily performed, and the influence of metal contamination can be avoided.

On the other hand, according to the SOI substrate 60 of the comparative example, even if a gettering layer is formed in the base substrate 61 which is a silicon substrate, since the silicon oxide layer 62 is formed between the base substrate 61 and the single crystal silicon layer 63, the single crystal silicon layer 63 may not obtain the gettering effect.

Hence, in the manufacturing method according to an embodiment of the present invention, the gettering function can be expected, and the metal contamination level in a process can be significantly improved, so that the level of dark current/white spots can be improved.

As a result, a solid-state image device capable of capturing a high quality image can be provided.

Furthermore, in the manufacturing method according to an embodiment of the present invention, the steps of the comparative example, which are the steps of a related manufacturing method, may be used except some steps thereof. The formation of the silicon epitaxial growth layer which is different from that of the comparative example can be performed by a related epitaxial growth technique.

In addition, a related smartcut method can be applied to the peeling of the silicon substrate 11 at the split layer 13.

Hence, the manufacturing method according to an embodiment of the present invention is similar to that applied to an existing product, can be performed at a low cost, and may not cause contamination troubles and the like.

In the manufacturing method according to an embodiment of the present invention, after the photoelectric conversion portions 21, the transfer gates 23, the peripheral circuit portion (not shown), the wiring layer 31, and the like are formed in and/or on the silicon epitaxial growth layer 12, the split layer 13 is formed. That is, the ion implantation treatment is performed at the stage at which a major portion of the solid-state image device 1, which is a surface irradiation type image sensor, is completed.

Accordingly, when the wires 32 of the wiring layer 31 are formed of a metal, ion implantation of hydrogen (H) ions or helium (He) ions is to be performed over the wires 32. Hence, knock-on of a constituent element (metal element) of the wires 32 may occur in some cases.

In addition, the project range Rp of ions becomes discontinuous due to the presence of the wires 32, and the discontinuity of the split layer 13 (fragile layer) may cause some problems in some cases.

As an ideal form of the split layer 13, a smooth and continuous fragile region is preferably formed at a predetermined depth from the surface. Hence, the following modified examples will be described.

[Modified Example 1 of the Manufacturing Method of a Solid-State Image Device]

Next, Modified Examples 1 and 2 of the manufacturing method of a solid-state image device according to an embodiment of the present invention will be described with reference to plan layout views of FIGS. 3A to 3D. In Modified Examples 1 and 2, a method for forming the split layer 13 will be described.

Figure 3A:
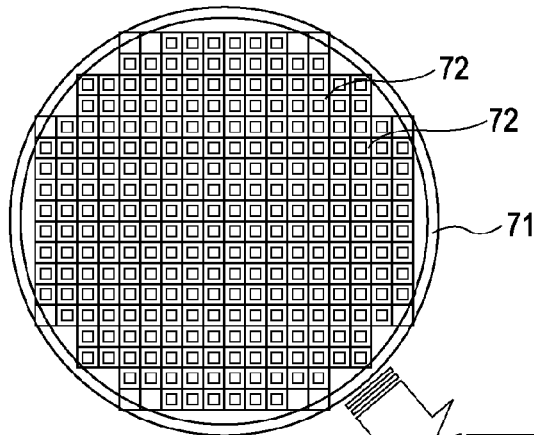
FIGS. 3A to 3D are plan layout views showing Modified Examples 1 and 2 of the manufacturing method of a solid-state image device according to an embodiment of the present invention.
Figure 3B:
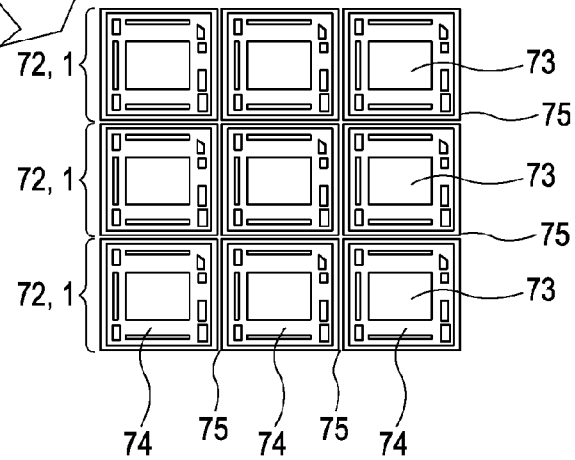

FIG. 3A shows an arrangement example of chips 72 on a wafer 71, and FIG. 3B is an enlarged view of the chips 72. One chip 72 functions as the solid-state image device 1. This solid-state image device 1 is formed of pixel portions 73, a peripheral circuit portion 74 formed along the periphery thereof, and a scribe region 75 which is to be used when the chips are separated from each other.

In Modified Examples 1 and 2, in order to suppress knock-on of metal ions primarily in the pixel portions, in a preceding step before the step of forming a wiring layer, hydrogen ion implantation or He ion implantation is performed to make the silicon substrate fragile.

In this step, when ion implantation is performed over the entire surface of the wafer, peeling may occur at the split layer (fragile layer) by a heat treatment performed in a subsequent wiring step; hence, a two-dimensional plurality time of ion implantation method is performed in order to make the split layer discontinuous.

In particular, ion implantation for the pixel portions 73 is performed in a preceding step before the step of forming a wiring layer (not shown).

For example, the photoelectric conversion portion, the transfer gate, and the like are formed in each of the pixel portions 73.

Figure 3C:
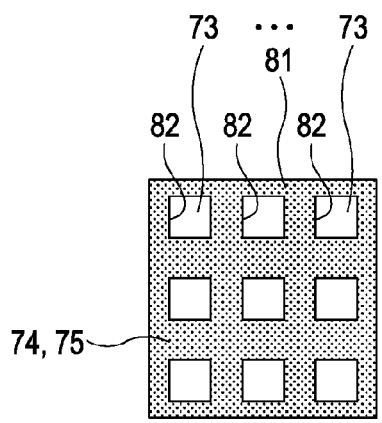

Subsequently, as shown in FIG. 3C, an ion implantation mask 81 is formed. This ion implantation mask 81 is formed, for example, of a resist and has opening portions 82 over the pixel portions 73. Hence, the above ion implantation mask 81 masks the peripheral circuit portions 74 and the scribe regions 75.

The above ion implantation mask 81 is formed by general resist application, exposure, and development treatments.

Next, by the use of the above ion implantation mask 81, ion implantation of hydrogen (H) or the like is performed in a silicon substrate (not shown) under the pixel portions 73, so that a first split layer (not shown) is formed in the silicon substrate under the pixel portions 73.

Subsequently, the above ion implantation mask 81 is removed. In the figure, the state right before the ion implantation mask 81 is removed is shown.

Next, ion implantation is performed so that the entire surface is finally processed by ion implantation, and as a result, a second split layer (not shown) is formed in a silicon substrate under the peripheral circuit portions 74 and the scribe regions 75. In addition, in the silicon substrate under the peripheral circuit portions 74 and the scribe regions 75, this second split layer is formed continuously from the first split layer.

In the second ion implantation, an ion implantation mask having opening portions over the peripheral circuit portions 74 and the scribe regions 75 is preferably used.

The above ion implantation mask may be formed of a resist as in the above ion implantation mask 81.

Subsequently, the ion implantation mask used for the second ion implantation is removed.

[Modified Example 2 of the Manufacturing Method of a Solid-State Image Device]

Figure 3D:
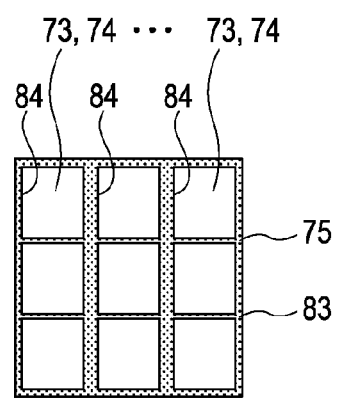

Alternatively, as shown in FIG. 3D, an ion implantation mask 83 is formed. This ion implantation mask 83 is formed, for example, of a resist and has opening portions 84 over the pixel portions 73 and the peripheral circuit portions 74. Hence, the ion implantation mask 83 masks the scribe regions 75.

The ion implantation mask 83 is formed by general resist application, exposure, and development treatments.

Next, by the use of the ion implantation mask 83, ion implantation of hydrogen (H) or the like is performed in a silicon substrate (not shown) under the pixel portions 73 and the peripheral circuit portions 74, so that a first split layer (not shown) is formed in the silicon substrate under the pixel portions 73 and the peripheral circuit portions 74.

Subsequently, the ion implantation mask 83 is removed.

Next, ion implantation is performed so that the entire surface is finally processed by ion implantation, and as a result, a second split layer (not shown) is formed in a silicon substrate under the scribe regions 75. In addition, in the silicon substrate under the scribe regions 75, this second split layer is formed continuously from the first split layer.

In the second ion implantation, an ion implantation mask having opening portions over the scribe regions is preferably used. The above ion implantation mask may be formed using a resist as in the above ion implantation mask 83.

Subsequently, the ion implantation mask used for the second ion implantation is removed.

[Modified Example 3 of the Manufacturing Method of a Solid-State Image Device]

Next, Modified Example 3 of the manufacturing method of a solid-state image device according to an embodiment of the present invention will be described with reference to manufacturing-process cross-sectional views of FIGS. 4A to 4C. In Modified Example 3, a method for forming the split layer 13 will be described.

As for the formation of the split layer 13, it is self-evident that the distance (Rp) from the surface of the silicon substrate by a plurality time of ion implantation preferably does not vary from place to place.

However, as described above, because of the presence of materials in the traveling paths of ions, that is, because of the presence of the photoelectric conversion portions 21, the transfer gates 23, the peripheral circuit portions (not shown), the wiring layer 31, and the like, the Rp varies from place to place. In particular, by the presence or absence of the wiring layer 31, the depth of the split layer 13, which is a fragile layer, varies.

This phenomenon indicates that the split layer 13 is in a non-continuous state and also indicates that the silicon substrate 11 may not be ideally peeled away.

Accordingly, in order to form the split layer 13, ion implantation is performed three times.

As shown in FIG. 4A, before the photoelectric conversion portions, the transfer gates, the peripheral circuit portions (not shown), the wiring layer, and the like are formed in and/or on the silicon epitaxial growth layer 12, a first ion implantation mask 85 having opening portions 86 over the pixel portions 73 is formed on the silicon epitaxial growth layer 12.

This first ion implantation mask 85 is formed, for example, of a resist by general resist application, exposure, and development treatments.

Next, by the use of the above first ion implantation mask 85, ion implantation of hydrogen (H) or the like is performed in the silicon substrate 11 under the pixel portions 73 to form a first split layer 13 (13-1) in the silicon substrate 11 under the pixel portions 73.

Subsequently, the first ion implantation mask 85 is removed.

Next, as shown in FIG. 4B, the photoelectric conversion portions 21, the transfer gates 23, the peripheral circuit portions 74 are formed in and/or on the silicon epitaxial growth layer 12. In the figure, wires of the peripheral circuit portions 74 are shown.

Furthermore, the wiring layer 31 is formed on the silicon epitaxial growth layer 12. The surface of this wiring layer 31 is planarized.

In addition, grooves 34 are preferably formed in the interlayer insulating film 33 of the wiring layer 31 over the scribe regions 75.

Subsequently, a second ion implantation mask 87 having opening portions 88 over the peripheral circuit portions 74 is formed on the wiring layer 31. This second ion implantation mask 87 is formed, for example, of a resist by general resist application, exposure, and development treatments.

Next, by the use of the above second ion implantation mask 87, ion implantation of hydrogen (H) or the like is performed in the silicon substrate 11 under the peripheral circuit portions 74 to form a second split layer 13 (13-2) in the silicon substrate 11 under the peripheral circuit portions 74.

In this ion implantation, the implantation energy is adjusted so that the second split layer 13-2 is formed at a depth approximately equivalent to that of the first split layer 13-1 so as to be continuous therefrom.

Subsequently, the second ion implantation mask 87 is removed.

Subsequently, as shown in FIG. 4C, a third ion implantation mask 89 having opening portions 90 over the scribe regions 75 is formed on the wiring layer 31. This third ion implantation mask 89 is formed, for example, of a resist by general resist application, exposure, and development treatments.

Next, by the use of the above third ion implantation mask 89, ion implantation of hydrogen (H) or the like is performed in the silicon substrate 11 under the scribe regions 75 to form a third split layer 13 (13-3) in the silicon substrate 11 under the scribe regions 75.

In this ion implantation, the implantation energy is adjusted so that the third split layer 13-3 is formed at a depth approximately equivalent to that of the first split layer 13-1 and that of the second split layer 13-2 so as to be continuous therefrom.

Subsequently, the third ion implantation mask 89 is removed.

As described above, since the ion implantation masks corresponding to formation patterns of the wiring layer 31 and the like are formed, and the ion implantation is performed several times, the discontinuity among the split layers 13 (13-1, 13-2, and 13-3) caused by the presence or absence of the wiring layer 31 and the like can be solved.

In addition, in the above plurality time of ion implantation, it is important to adjust the total dose of the ion implantations to satisfy a target value and also to form the three split layers 13 at depths approximately equivalent to each other. Hence, the implantation energy of each of the ion implantations is preferably optimized so that the project ranges (Rps) in the silicon substrate 11 do not vary therebetween.

Figure 5:
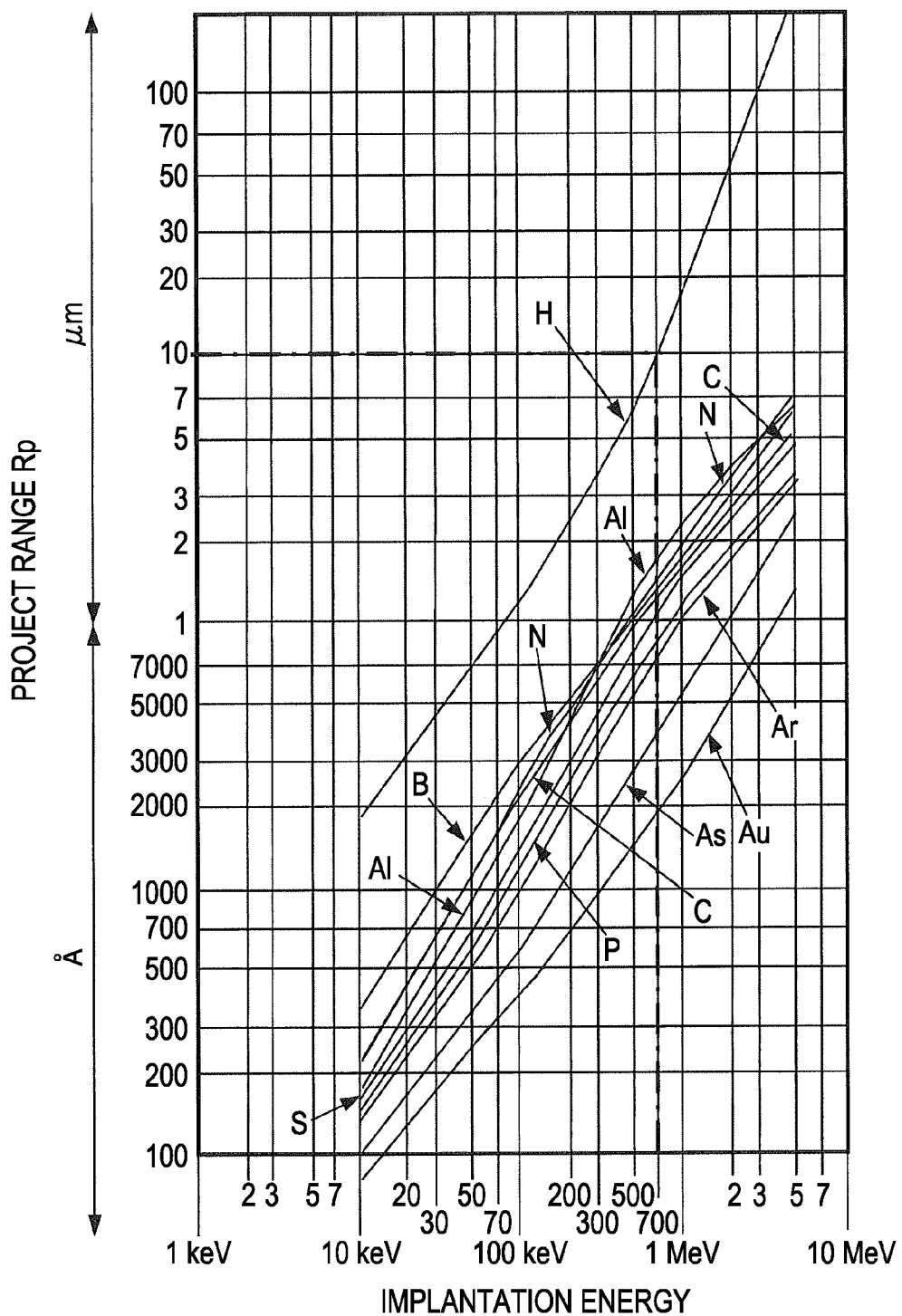
FIG. 5 is a graph showing the relationship between the project range of each element and the implantation energy applied thereto.

As a reference example, the relationship between the project range of each element and the implantation energy applied thereto is shown in FIG. 5.

As shown in FIG. 5, for example, when ion implantation of hydrogen is performed, it is found that a project range Rp of 10 μm is obtained when the implantation energy is set to 700 keV. Furthermore, in order to obtain a project range Rp of 3 μm, the implantation energy may be set to 250 keV.

The manufacturing method of a solid-state image device according to an embodiment of the present invention is not a technique limited to a CMOS image sensor (CIS). For example, the above manufacturing method may be applied to all solid-state image devices, such as a charge couple device (CCD).

When the above manufacturing method is applied to a CMOS image sensor, in the step of forming transfer gates, pixel transistors may be formed.

In addition, when the above manufacturing method is applied to a charge couple device, in the step of forming transfer gates, transfer electrodes may be formed.

As has thus been described, in the manufacturing method of a solid-state image device according to an embodiment of the present invention, an SOI substrate which is higher than a bulk silicon substrate in terms of cost is not used, the manufacturing cost can be reduced.

In addition, in this manufacturing method, a bulk silicon substrate is used, and after the photoelectric conversion portions, the transfer gates, the wiring layer, and the like are formed in and/or on the silicon epitaxial growth layer which is formed on the above silicon substrate, the support substrate is adhered onto the wiring layer.

Subsequently, the base substrate is peeled away by a method in accordance with the smartcut method. Hence, without using an SOI substrate, a rear surface irradiation type image sensor can be formed.

In addition, since elements such as the photoelectric conversion portions are formed in the epitaxial growth layer which is directly formed on the silicon substrate, when a gettering layer is formed in the silicon substrate, the gettering effect can be expected. In this case, since a silicon oxide layer is not formed between the silicon substrate and the epitaxial growth layer unlike the case of an SOI substrate, the gettering effect can be expected.

[Example of a Solid-State Image Device Formed by the Manufacturing Method According to an Embodiment of the Invention]

Next, as one example of a solid-state image device manufactured by the manufacturing method of a solid-state image device according to an embodiment of the present invention, a rear surface irradiation type CMOS image sensor will be described with reference to FIG. 6.

Figure 6:
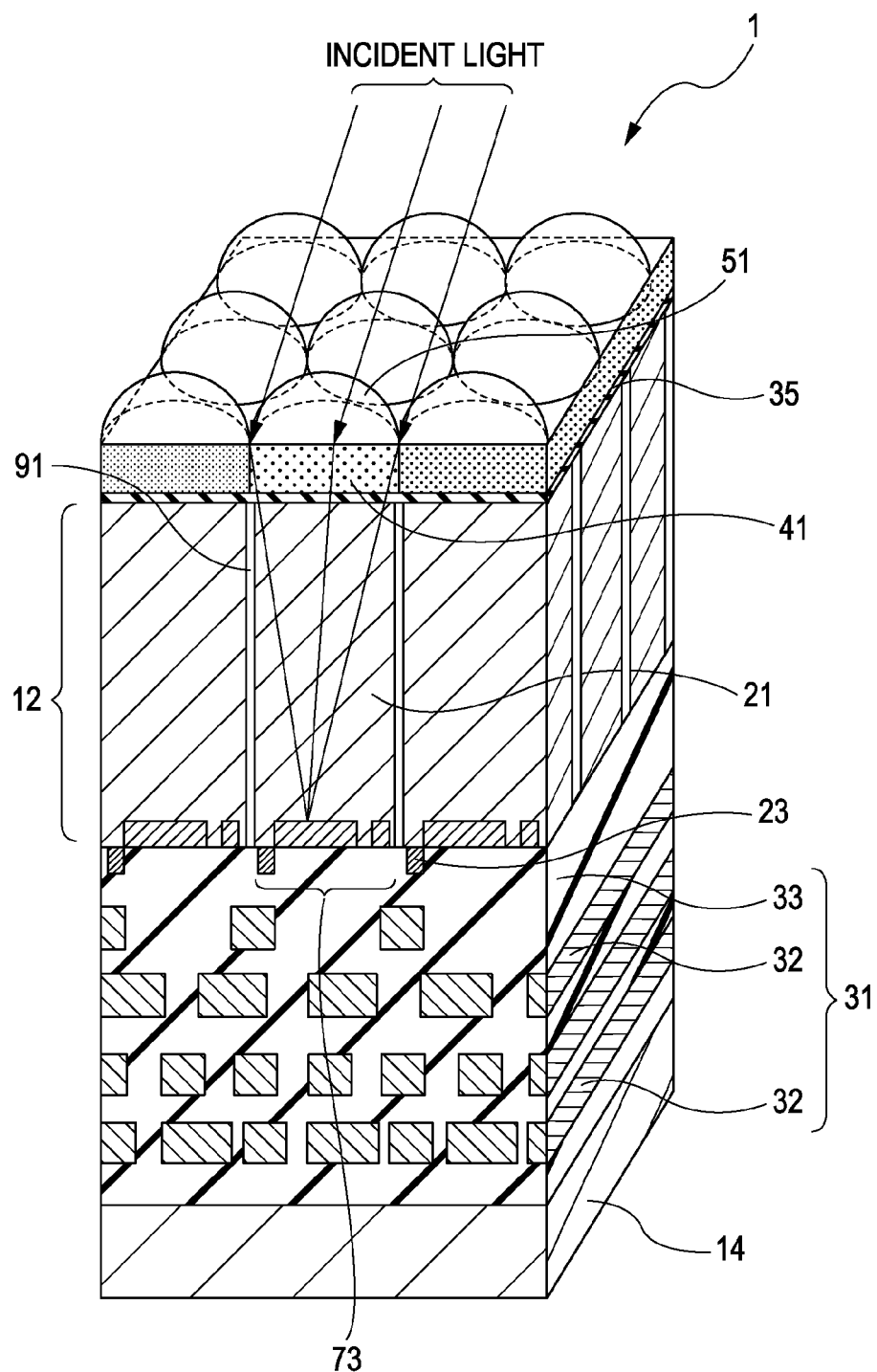
FIG. 6 is a perspective cross-sectional view showing a schematic structure of a rear surface irradiation type CMOS image sensor.

As shown in FIG. 6, the pixel portions 73 each including the photoelectric conversion portion (such as a photodiode) 21 which converts incident light into an electrical signal, the transfer gate 23, and pixel transistors (some thereof are shown in the figure), such as an amplifying transistor and a reset transistor, are formed in an active layer formed of the silicon epitaxial growth layer 12. Furthermore, a signal processing portion (not shown) processing a signal charge read from the corresponding photoelectric conversion portion 21 is also formed.

In addition, element isolation regions 91 are formed in parts of the peripheries of the pixel portions 73, for example, between pixel portions 73 in a row direction and/or in a column direction.

In addition, the wiring layer 31 is formed on the surface (in the figure, at the lower side of the silicon epitaxial growth layer 12) of the silicon epitaxial growth layer 12 in which the photoelectric conversion portions 21 are formed. This wiring layer 31 is formed of the wires 32 and the interlayer insulating film 33 covering the wires 32.

Furthermore, the support substrate 14 is formed on the wiring layer 31.

In addition, in the solid-state image device 1, a planarization film 35 having optical transparency is formed on the rear surface (at the upper surface side in the figure) of the silicon epitaxial growth layer 12. Furthermore, the color filter layers 41 are formed on this planarization film 35. In addition, on the color filter layers 41, the condenser lenses 51 condensing incident light to the respective photoelectric conversion portions 21 are formed.

In order to improve the quantum efficiency of incident light, the above solid-state image device 1 has a different structure from that of a surface irradiation type CMOS image sensor in which a wiring layer is formed closer to the side on which light is incident than photoelectric conversion portions, that is, in the solid-state image device 1, the photoelectric conversion portions 21 are disposed closer to the side on which light is incident than the wiring layer 31. As a result, an eclipse phenomenon of incident light caused by the wiring layer 31 can be avoided.

[Application Example of a Solid-State Image Device Formed by the Manufacturing Method According to an Embodiment of the Invention]

Next, as one application example of a solid-state image device formed by the manufacturing method according to an embodiment of the present invention, one image pick-up apparatus will be described with reference to a block diagram of FIG. 7. This image pick-up apparatus is formed using a solid-state image device manufactured by the manufacturing method according to an embodiment of the present invention.

Figure 7:
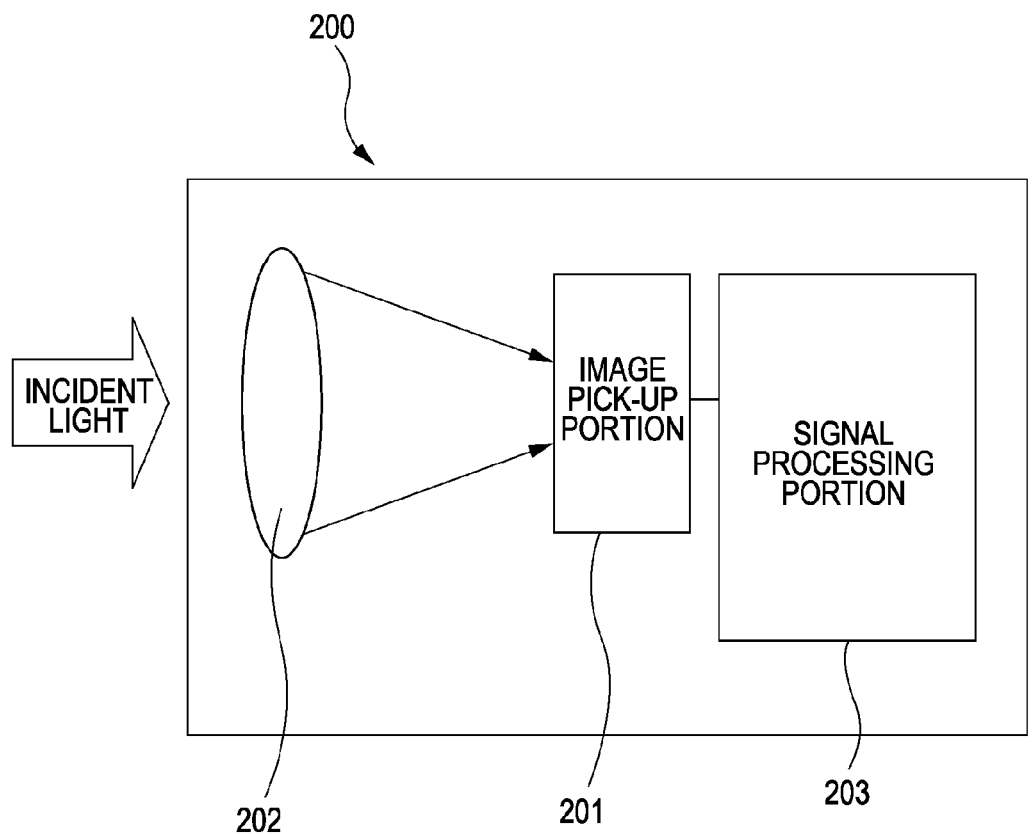
FIG. 7 is a block diagram showing one example of an image pick-up apparatus which uses a solid-state image device formed by the manufacturing method according to an embodiment of the present invention.
Figure 8A:
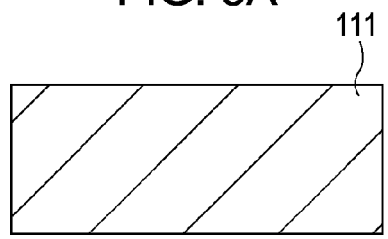
FIGS. 8A to 8F are manufacturing-process cross-sectional views showing a manufacturing method using a smartcut method.
Figure 8B:
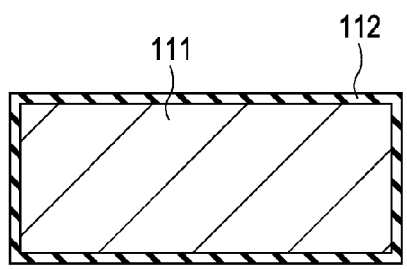
Figure 8C:
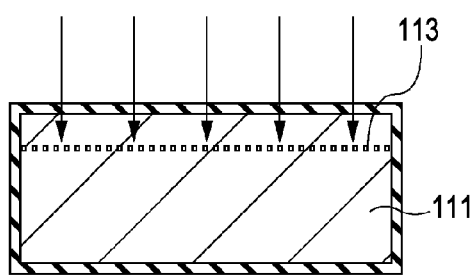
Figure 8D:
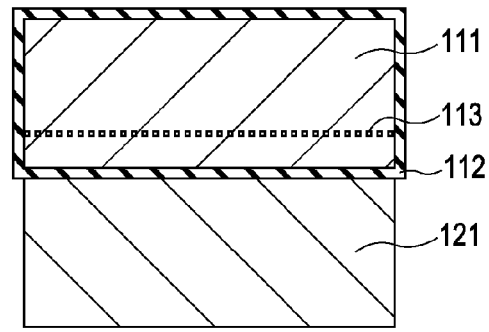
Figure 8E:
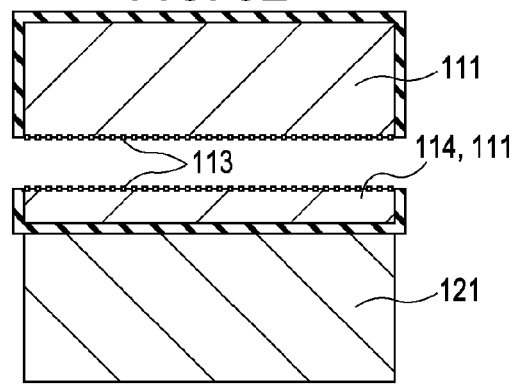
Figure 8F:
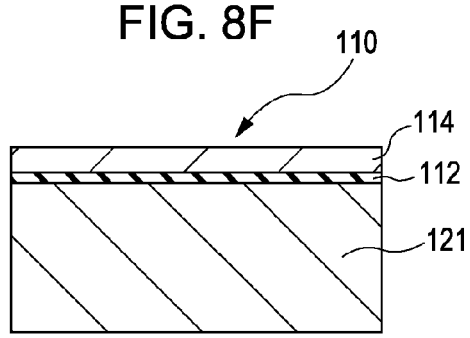
Figure 9A:
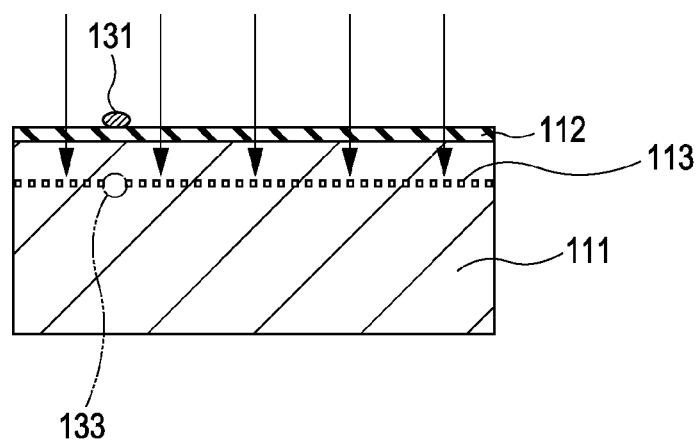
FIGS. 9A and 9B are manufacturing-process cross-sectional views showing a problem of the smartcut method.
Figure 9B:
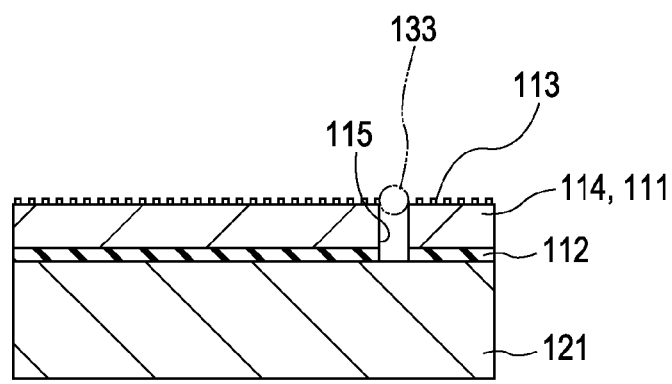
Figure 10A:
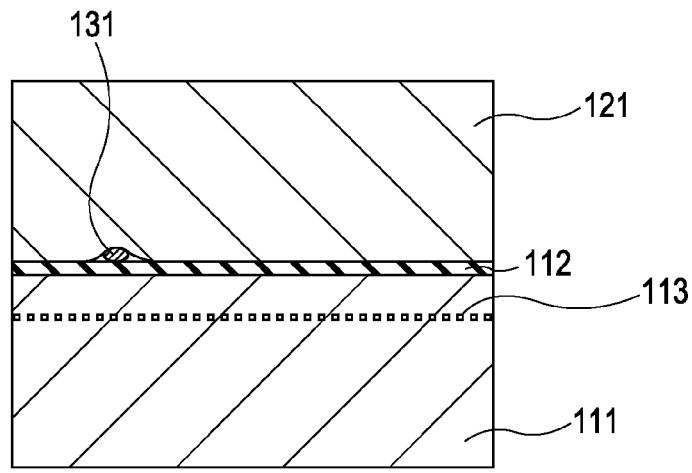
FIGS. 10A and 10B are manufacturing-process cross-sectional views showing a problem of the smartcut method.
Figure 10B:
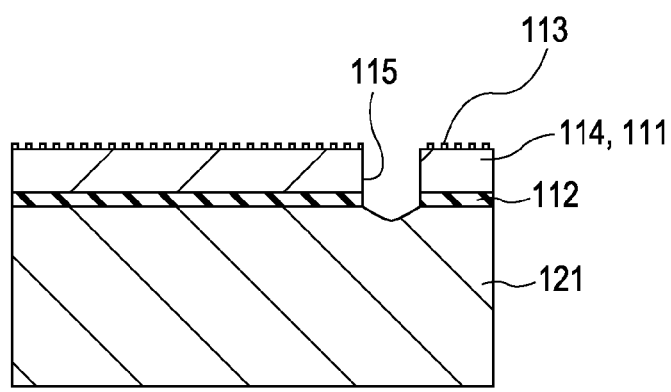
Figure 11A:
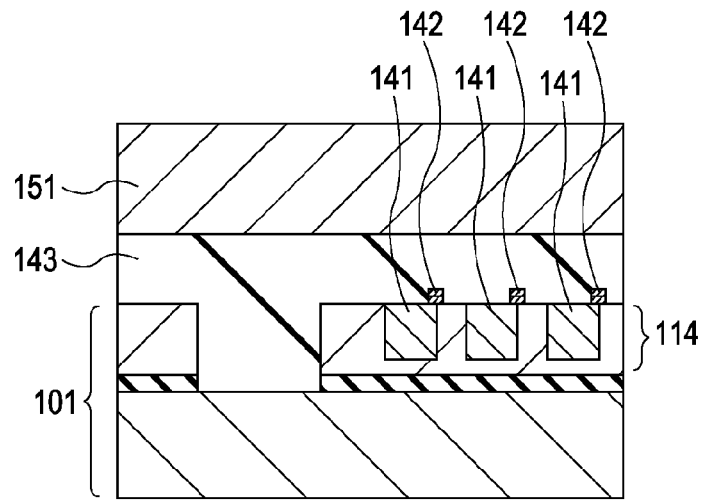
FIGS. 11A and 11B are manufacturing-process cross-sectional views showing the case in which the smartcut method is applied to a manufacturing method disclosed in Japanese Unexamined Patent Application Publication No. 2007-13089.
Figure 11B:
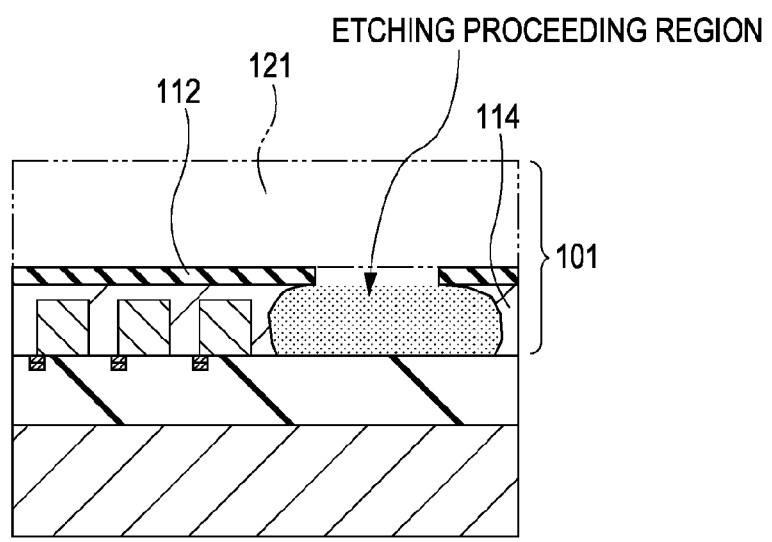
Figure 12:
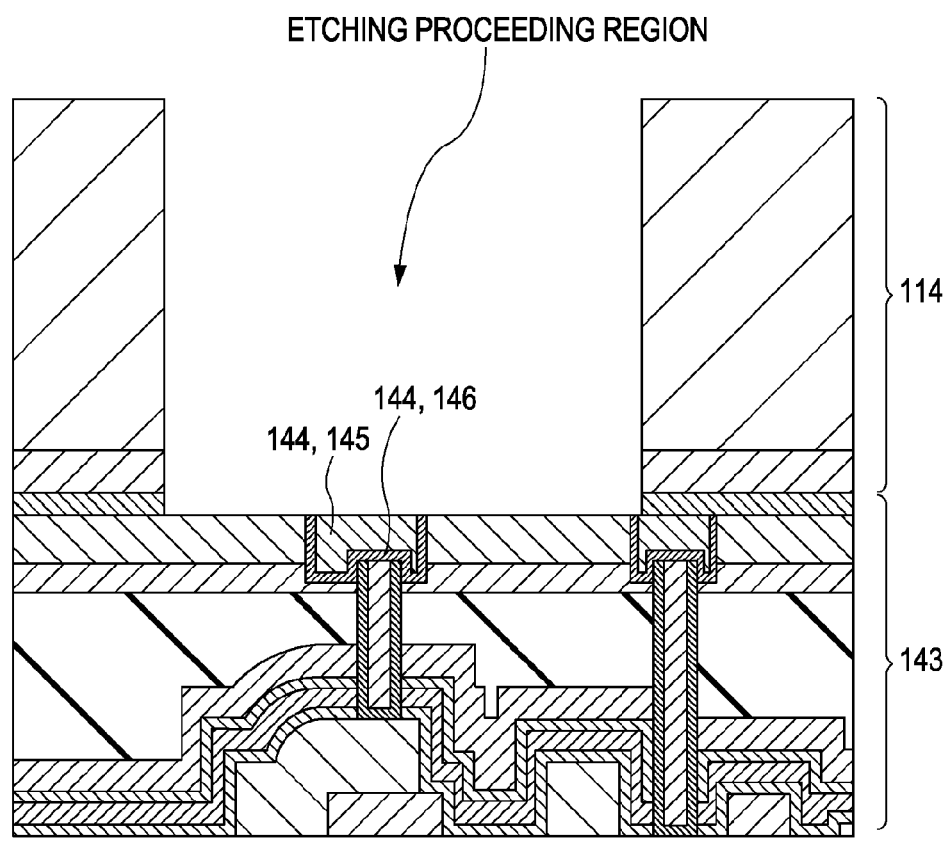
FIG. 12 is a schematic cross-sectional view showing a problem of the manufacturing method to which the smartcut method is applied.

As shown in FIG. 7, an image pick-up apparatus 200 has a solid-state image device (not shown) in an image pick-up portion 201.

An image forming optical portion 202 is provided at a light condensing side of this image pick-up portion 201, and the image pick-up portion 201 is connected to a signal processing portion 203 which includes a drive circuit for driving the image pick-up portion 201, a signal processing circuit for processing a signal photoelectric-converted by the solid-state image device into an image, and the like.

In addition, the image signal processed by the above signal processing portion 203 can be recorded in an image recording portion (not shown).

In the image pick-up apparatus 200 described above, the solid-state image device 1 formed by the manufacturing method described in each embodiment can be used as the solid-state image device of the above image pick-up portion 201.

Since the solid-state image device 1 according to an embodiment of the present invention is used in the image pick-up apparatus 200, the generation of white spots can be suppressed. Hence, the image quality can be suppressed from being degraded, and as a result, a high quality image can be advantageously obtained.

In addition, the image pick-up apparatus 200 is not particularly limited to the structure described above, and as long as the solid-state image device formed by the manufacturing method according to an embodiment of the present invention is used, the image pick-up apparatus 200 may have any structure.

In addition, the solid-state image device 1 may be formed as a chip device or a module having an image pick-up function in which an image pick-up portion and a signal processing portion or an optical system are collectively integrated.

The image pick-up apparatus 200 described above may be, used, for example, as a camera or a mobile apparatus having an image pick-up function. In addition, the "image pick-up" not only indicates capturing of an image in general camera shooting but also indicates, as a wide meaning, finger print detection and the like.

It should be understood by those skilled in the art that various modifications, combinations, sub-combinations and alterations may occur depending on design requirements and other factors insofar as they are within the scope of the appended claims or the equivalents thereof.

What is claimed is:

1. A method for manufacturing a solid-state image device, comprising the steps of:
   forming a first silicon layer on a silicon substrate;
   forming a photoelectric conversion portion and transfer gate with respect to the first silicon layer and forming a wiring layer on the first silicon layer;
   forming a split layer in the silicon substrate;
   forming a second substrate on the wiring layer;
   removing a portion of the silicon substrate and leaving a second silicon layer at a side of the second substrate, the second silicon layer being from a remaining portion of the silicon substrate; and
   planarizing a surface of the second silicon layer.

2. The method for manufacturing the solid-state image device according to claim 1, wherein the split layer is formed by performing ion implantation of hydrogen or a noble gas into the silicon substrate.

3. The method for manufacturing the solid-state image device according to claim 2, wherein the ion implantation forming the split layer includes:
   a first ion implantation forming a first split layer in the silicon substrate under pixel portions in which the photoelectric conversion portions and the transfer gates are formed in and/or on the first silicon layer;
   a second ion implantation forming a second split layer in the silicon substrate under a peripheral circuit portion formed along a periphery of the pixel portions; and
   a third ion implantation forming a third split layer in the silicon substrate under a scribe region surrounding the pixel portions and the peripheral circuit portion, and
   implantation energy levels of the first, second, and third ion implantations are adjusted so that the first split layer, the second split layer, and the third split layer are formed at the same depth.

4. The method for manufacturing a solid-state image device according to claim 2, wherein the ion implantation forming the split layer includes:
   a first ion implantation forming a first split layer in the silicon substrate under pixel portions in which the photoelectric conversion portions and the transfer gates are formed in and/or on the silicon epitaxial growth layer;
   a second ion implantation forming a second split layer in the silicon substrate under the peripheral circuit portion formed along the periphery of the pixel portions; and
   a third ion implantation forming a third split layer in the silicon substrate under a scribe region surrounding the pixel portions and the peripheral circuit portion, implantation energy levels of the three ion implantations are adjusted so that the first split layer, the second split layer, and the third split layer are formed at the same depth; and the second split layer and the third split layer comprise the region that is formed after the wiring layer.

5. The method for manufacturing a solid-state image device according to claim 2, wherein the ion implantation forming the split layer includes:
   a first ion implantation forming a first split layer in the silicon substrate under pixel portions in which the photoelectric conversion portions and the transfer gates are formed in and/or on the silicon epitaxial growth layer; and
   a second ion implantation forming a second split layer continuously from the first split layer in the silicon substrate under the peripheral circuit portion formed along the periphery of the pixel portions and under a scribe region surrounding the pixel portions and the peripheral circuit portion.

6. The method for manufacturing a solid-state image device according to claim 2, wherein the ion implantation forming the split layer includes:
   a first ion implantation forming a first split layer in the silicon substrate under pixel portions in which the photoelectric conversion portions and the transfer gates are formed in and/or on the silicon epitaxial growth layer and under the peripheral circuit portion formed along the periphery of the pixel portions; and
   a second ion implantation forming a second split layer continuously from the first split layer in the silicon substrate under a scribe region surrounding the pixel portions and the peripheral circuit portion.

7. The method for manufacturing the solid-state image device according to claim 1, wherein the silicon substrate includes a gettering layer.

8. The method for manufacturing the solid-state image device according to claim 7, wherein the split layer is formed by performing ion implantation of hydrogen or a noble gas into the silicon substrate.

9. The method for manufacturing a solid-state image device according to claim 8, wherein the ion implantation forming the split layer includes:
   a first ion implantation forming a first split layer in the silicon substrate under pixel portions in which the photoelectric conversion portions and the transfer gates are formed in and/or on the first silicon layer;
   a second ion implantation forming a second split layer in the silicon substrate under a peripheral circuit portion formed along a periphery of the pixel portions; and
   a third ion implantation forming a third split layer in the silicon substrate under a scribe region surrounding the pixel portions and the peripheral circuit portion, and implantation energy levels of the first, second, and third ion implantations are adjusted so that the first split layer, the second split layer, and the third split layer are formed at the same depth.

10. The method for manufacturing a solid-state image device according to claim 8, wherein the ion implantation forming the split layer includes:
   a first ion implantation forming a first split layer in the silicon substrate under pixel portions in which the photoelectric conversion portions and the transfer gates are formed in and/or on the silicon epitaxial growth layer;
   a second ion implantation forming a second split layer in the silicon substrate under the peripheral circuit portion formed along the periphery of the pixel portions; and
   a third ion implantation forming a third split layer in the silicon substrate under a scribe region surrounding the pixel portions and the peripheral circuit portion, implantation energy levels of the three ion implantations are adjusted so that the first split layer, the second split layer, and the third split layer are formed at the same depth; and the second split layer and the third split layer comprise the region that is formed after the wiring layer.

11. The method for manufacturing a solid-state image device according to claim 8, wherein the ion implantation forming the split layer includes:
   a first ion implantation forming a first split layer in the silicon substrate under pixel portions in which the photoelectric conversion portions and the transfer gates are formed in and/or on the silicon epitaxial growth layer; and
   a second ion implantation forming a second split layer continuously from the first split layer in the silicon substrate under the peripheral circuit portion formed along the periphery of the pixel portions and under a scribe region surrounding the pixel portions and the peripheral circuit portion.

12. The method for manufacturing a solid-state image device according to claim 8, wherein the ion implantation forming the split layer includes:
   a first ion implantation forming a first split layer in the silicon substrate under pixel portions in which the photoelectric conversion portions and the transfer gates are formed in and/or on the silicon epitaxial growth layer and under the peripheral circuit portion formed along the periphery of the pixel portions; and
   a second ion implantation forming a second split layer continuously from the first split layer in the silicon substrate under a scribe region surrounding the pixel portions and the peripheral circuit portion.

* * * * *